US012618147B2

(12) United States Patent
Hu et al.

(10) Patent No.: US 12,618,147 B2
(45) Date of Patent: May 5, 2026

(54) METHODS FOR DEPOSITING PHOSPHORUS-DOPED SILICON NITRIDE FILMS

(71) Applicant: Applied Materials, Inc., Santa Clara, CA (US)

(72) Inventors: Kesong Hu, Pleasanton, CA (US); Rana Howlader, San Jose, CA (US); Michael Wenyoung Tsiang, Fremont, CA (US); Xinhai Han, Santa Clara, CA (US); Hang Yu, Woodland, CA (US); Deenesh Padhi, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 1258 days.

(21) Appl. No.: 16/600,894

(22) Filed: Oct. 14, 2019

(65) Prior Publication Data

US 2020/0190664 A1     Jun. 18, 2020

Related U.S. Application Data

(60) Provisional application No. 62/779,002, filed on Dec. 13, 2018.

(51) Int. Cl.
*C23C 16/34*          (2006.01)
*H01J 37/32*          (2006.01)
(Continued)

(52) U.S. Cl.
CPC ...... *C23C 16/345* (2013.01); *H01J 37/32146* (2013.01); *H10P 14/6336* (2026.01); *H10P 14/69433* (2026.01); *H01J 2237/3321* (2013.01)

(58) Field of Classification Search
None
See application file for complete search history.

(56) References Cited

U.S. PATENT DOCUMENTS 5,902,650  A     5/1999   Feng et al.
5,968,611  A    10/1999   Kaloyeros et al.
                  (Continued)

FOREIGN PATENT DOCUMENTS

CN          102652186  A     8/2012
JP           56413732  A     1/1989
                  (Continued)

OTHER PUBLICATIONS

Y. K. Fang et al 1985 J. Electrochem. Soc. 132, 1222. (Year: 1985).*
(Continued)

*Primary Examiner* — Mandy C Louie
(74) *Attorney, Agent, or Firm* — Patterson + Sheridan, LLP

(57)          ABSTRACT

Methods for depositing hardmask materials and films, and more specifically, for depositing phosphorus-doped, silicon nitride films are provided. A method of depositing a material on a substrate in a processing chamber includes exposing a substrate to a deposition gas in the presence of RF power to deposit a phosphorus-doped, silicon nitride film on the substrate during a plasma-enhanced chemical vapor deposition (PE-CVD) process. The deposition gas contains one or more silicon precursors, one or more nitrogen precursors, one or more phosphorus precursors, and one or more carrier gases. The phosphorus-doped, silicon nitride film has a phosphorus concentration in a range from about 0.1 atomic percent (at %) to about 10 at %.

20 Claims, 3 Drawing Sheets

(51) Int. Cl.
  *H10P 14/60*          (2026.01)
  *H10P 14/694*        (2026.01)

(56)                References Cited

U.S. PATENT DOCUMENTS

| | | | |
|---|---|---|---|
| 6,364,954 | B2 | 4/2002 | Umotoy et al. |
| 6,677,247 | B2 | 1/2004 | Yuan et al. |
| 6,756,323 | B2 | 6/2004 | Grill et al. |
| 6,770,573 | B2 | 8/2004 | Grill et al. |
| 6,825,134 | B2 | 11/2004 | Law et al. |
| 6,869,838 | B2 | 3/2005 | Law et al. |
| 7,122,454 | B2 | 10/2006 | Olsen |
| 7,311,857 | B2 | 12/2007 | Ko et al. |
| 7,429,540 | B2 | 9/2008 | Olsen |
| 7,473,655 | B2 | 1/2009 | Wang et al. |
| 7,601,652 | B2 | 10/2009 | Singh et al. |
| 7,648,927 | B2 | 1/2010 | Singh et al. |
| 7,651,955 | B2 | 1/2010 | Ranish et al. |
| 7,964,514 | B2 | 6/2011 | Chua |
| 8,061,299 | B2 | 11/2011 | Engle |
| 8,129,290 | B2 | 3/2012 | Balseanu et al. |
| 8,138,104 | B2 | 3/2012 | Balseanu et al. |
| 2002/0090835 | A1 | 7/2002 | Chakravarti et al. |
| 2003/0059535 | A1 | 3/2003 | Luo et al. |
| 2003/0139062 | A1 | 7/2003 | Grill et al. |
| 2003/0215570 | A1 | 11/2003 | Seutter et al. |
| 2004/0018738 | A1 | 1/2004 | Liu |
| 2004/0175961 | A1 | 9/2004 | Olsen |
| 2006/0019032 | A1 | 1/2006 | Wang et al. |
| 2006/0084283 | A1 | 4/2006 | Paranjpe et al. |
| 2006/0286774 | A1 | 12/2006 | Singh et al. |
| 2006/0286819 | A1 | 12/2006 | Seutter et al. |
| 2007/0169696 | A1 | 7/2007 | Olsen |
| 2007/0207624 | A1 | 9/2007 | Chua |
| 2008/0020591 | A1* | 1/2008 | Balseanu .......... H01L 21/31111 |
| | | | 438/761 |
| 2008/0032510 | A1 | 2/2008 | Olsen |
| 2008/0090425 | A9 | 4/2008 | Olsen |
| 2010/0018460 | A1 | 1/2010 | Singh et al. |
| 2012/0196450 | A1 | 8/2012 | Balseanu |
| 2016/0086794 | A9 | 3/2016 | Cheng et al. |

FOREIGN PATENT DOCUMENTS

| | | |
|---|---|---|
| JP | 2004095909 A | 3/2004 |
| KR | 20010032496 A | 4/2001 |
| WO | 2012092020 A2 | 7/2012 |

OTHER PUBLICATIONS

International Search Report and Written Opinion dated Jan. 31, 2020 for Application No. PCT/US2019/056066.
Chinese Office Action dated Dec. 9, 2022 for Application No. 201980081255.6.
Chinese Office Action dated May 25, 2023 for Application No. 201980081255.6.
Taiwan Office Action dated Jun. 27, 2023 for Application No. 108137822.
Korean Office Action dated May 20, 2024 for Application No. 10-2021-7021633.

* cited by examiner

METHODS FOR DEPOSITING PHOSPHORUS-DOPED SILICON NITRIDE FILMS

CROSS-REFERENCE TO RELATED APPLICATIONS

This application claims benefit to U.S. Appl. No. 62/779,002, filed on Dec. 13, 2018, which is herein incorporated by reference.

BACKGROUND

Field

Embodiments of the present disclosure generally relate to deposition processes, and in particular to vapor deposition processes for depositing silicon nitride films.

Description of the Related Art

Integrated circuits have evolved into complex devices that can include millions of transistors, capacitors and resistors on a single chip. The evolution of chip designs continually requires faster circuitry and greater circuit density. The demands for faster circuits with greater circuit densities impose corresponding demands on the materials used to fabricate such integrated circuits. In particular, as the dimensions of integrated circuit components are reduced to the sub-micron scale, it is now desirable to use low resistivity conductive materials as well as low dielectric constant insulating materials to obtain suitable electrical performance from such components.

The demands for greater integrated circuit densities also impose demands on the process sequences used in the manufacture of integrated circuit components. For example, in process sequences that use conventional photo lithographic techniques, a layer of energy sensitive resist is formed over a stack of material layers disposed on a substrate. The energy sensitive resist layer is exposed to an image of a pattern to form a photoresist mask. Thereafter, the mask pattern is transferred to one or more of the material layers of the stack using an etch process. The chemical etchant used in the etch process is selected to have a greater etch selectivity for the material layers of the stack than for the mask of energy sensitive resist. That is, the chemical etchant etches the one or more layers of the material stack at a rate much faster than the energy sensitive resist. The etch selectivity to the one or more material layers of the stack over the resist prevents the energy sensitive resist from being consumed prior to completion of the pattern transfer. Thus, a highly selective etchant enhances accurate pattern transfer.

As the pattern dimensions are reduced, the thickness of the energy sensitive resist must correspondingly be reduced in order to control pattern resolution. Such thin resist layers can be insufficient to mask underlying material layers during the pattern transfer step due to attack by the chemical etchant. An intermediate layer called a hardmask is often used between the energy sensitive resist layer and the underlying material layers to facilitate pattern transfer because of its greater resistance to the chemical etchant. It is desirable to have thin hardmasks that have both high etch selectivity and are easy to remove after the etching process is complete. As critical dimensions decrease, current hardmask materials lack the desired etch selectivity relative to underlying materials and are often difficult to remove.

Thus, there is a need for improved methods for depositing hardmask materials and films.

SUMMARY OF THE DISCLOSURE

Embodiments provide methods for depositing hardmask materials and films, and more specifically, for depositing phosphorus-doped, silicon nitride films. In one or more embodiments, a method of depositing a material on a substrate in a processing chamber includes exposing a substrate to a deposition gas in the presence of RF power to deposit a phosphorus-doped, silicon nitride film on the substrate during a plasma-enhanced chemical vapor deposition (PE-CVD) process. The deposition gas contains one or more silicon precursors, one or more nitrogen precursors, one or more phosphorus precursors, and one or more carrier gases. The phosphorus-doped, silicon nitride film has a phosphorus concentration in a range from about 0.1 atomic percent (at %) to about 10 at %.

In some embodiments, a method of depositing a material on a substrate in a processing chamber includes exposing a substrate to a deposition gas while depositing a phosphorus-doped, silicon nitride film on the substrate during a PE-CVD process. The deposition gas contains one or more silicon precursors, one or more nitrogen precursors, one or more phosphorus precursors, and one or more carrier gases. The phosphorus-doped, silicon nitride film has a phosphorus concentration in a range from about 0.5 at % to about 8 at %.

In other embodiments, a method of depositing a material on a substrate in a processing chamber includes exposing a substrate to a deposition gas to deposit a phosphorus-doped, silicon nitride film on the substrate during a PE-CVD process, where the deposition gas contains one or more silicon precursors, one or more nitrogen precursors, one or more phosphorus precursors, and one or more carrier gases and the phosphorus-doped, silicon nitride film has a phosphorus concentration in a range from about 0.1 at % to about 10 at %. The method also includes ceasing the PE-CVD process, then exposing the substrate to a nitrogen plasma to densify the phosphorus-doped, silicon nitride film during a nitrogen-plasma process, and ceasing the nitrogen-plasma process. The method further includes sequentially repeating cycles of the PE-CVD process and the nitrogen-plasma process.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

FIG. 2 depicts a schematic cross-sectional view of a substrate structure incorporating a phosphorus-doped, silicon nitride film as a hardmask layer, as discussed and described in one or more embodiments herein.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

Embodiments discussed and described herein provide methods for depositing hardmask materials and films, and more specifically, for depositing phosphorus-doped, silicon nitride films on substrates. In one or more embodiments, a method for depositing such materials includes exposing a substrate to a deposition gas in the presence of RF power to deposit a phosphorus-doped, silicon nitride film on the substrate during a plasma-enhanced chemical vapor deposition (PE-CVD) process. In some examples, the deposition method includes turning off the RF power while continuing to expose the substrate to the deposition gas. The deposition gas contains one or more silicon precursors, one or more nitrogen precursors, one or more phosphorus precursors, and one or more carrier gases. The phosphorus is in-situ doped or otherwise co-deposited with the silicon and the nitrogen to produce the phosphorus-doped, silicon nitride film or material. The phosphorus-doped, silicon nitride film has a phosphorus concentration in a range from about 0.1 atomic percent (at %) to about 10 at %.

Figure 1:
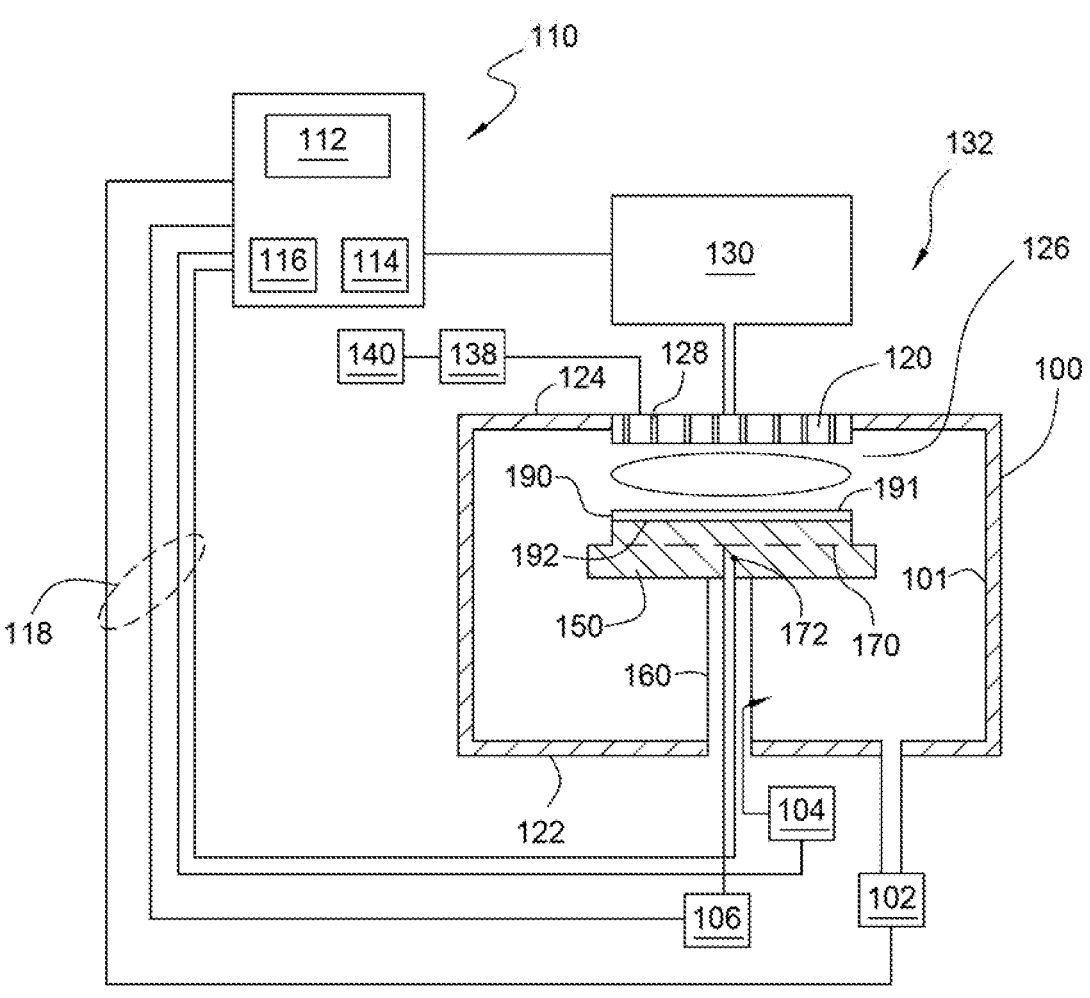
FIG. 1 depict a schematic illustration of an apparatus that can be used to conduct deposition methods, as discussed and described in one or more embodiments herein.

FIG. 1 depicts a schematic illustration of a substrate processing system 132 that can be used to perform phosphorus-doped, silicon nitride deposition in accordance with embodiments described herein. Examples of suitable systems, which can be used as substrate processing system 132, include the CENTURA® systems which may use a DxZ™ processing chamber, PRECISION™ 5000 systems, PRODUCER® SE or GT processing chamber or system, which are commercially available from Applied Materials, Inc., Santa Clara, Calif. It is contemplated that other processing system, including those available from other manufacturers, may be adapted to practice the embodiments described herein.

The processing system 132 includes a process chamber 100 coupled to a gas panel 130 and a controller 110. The process chamber 100 generally includes a top 124, a side 101 and a bottom wall 122 that define an interior processing volume 126. A support pedestal 150 is provided in the interior processing volume 126 of the process chamber 100. The substrate support pedestal 150 is supported by a stem 160 and may be typically fabricated from aluminum, ceramic, and other suitable materials. The substrate support pedestal 150 may be moved in a vertical direction inside the process chamber 100 using a displacement mechanism (not shown).

The substrate support pedestal 150 may include an embedded heater element 170 suitable for controlling the temperature of a substrate 190 supported on a surface 192 of the substrate support pedestal 150. The substrate support pedestal 150 may be resistively heated by applying an electric current from a power supply 106 to the heater element 170. The heater element 170 may be made of a nickel-chromium wire encapsulated in a nickel-iron-chromium alloy (e.g., INCOLOY® alloy) sheath tube. The electric current supplied from the power supply 106 is regulated by the controller 110 to control the heat generated by the heater element 170, thereby maintaining the substrate 190 and the substrate support pedestal 150 at a substantially constant temperature during film deposition. The supplied electric current may be adjusted to selectively control the temperature of the substrate support pedestal 150 in a range from about 100° C. to about 700° C.

A temperature sensor 172, such as a thermocouple, may be embedded in the support pedestal 150 to monitor the temperature of the substrate support pedestal 150 in a conventional manner. The measured temperature is used by the controller 110 to control the power supplied to the heating element 170 to maintain the substrate at a desired temperature.

A vacuum pump 102 is coupled to a port formed in the bottom of the process chamber 100. The vacuum pump 102 is used to maintain a desired gas pressure in the process chamber 100. The vacuum pump 102 also evacuates post-processing gases and by-products of the process from the process chamber 100. Although not shown, the processing system 132 may further include additional equipment for controlling the chamber pressure, for example, valves (e.g., throttle valves and isolation valves) positioned between the process chamber 100 and the vacuum pump 102 to control the chamber pressure.

A showerhead 120 having a plurality of apertures 128 is disposed on the top of the process chamber 100 above the substrate support pedestal 150. The apertures 128 of the showerhead 120 are utilized to introduce deposition gases into the process chamber 100. The apertures 128 may have different sizes, number, distributions, shape, design, and diameters to facilitate the flow of the various deposition gases for different process requirements. The showerhead 120 is connected to the gas panel 130 that allows various gases to supply to the interior processing volume 126 during process. A plasma is formed from the deposition gas mixture exiting the showerhead 120 to enhance thermal decomposition of the deposition gases resulting in the deposition of material on a surface 191 of the substrate 190.

The showerhead 120 and the substrate support pedestal 150 may form a pair of spaced apart electrodes in the interior processing volume 126. One or more RF power sources 140 provide a bias potential through a matching network 138 to the showerhead 120 to facilitate generation of plasma between the showerhead 120 and the substrate support pedestal 150. Alternatively, the RF power sources 140 and matching network 138 may be coupled to the showerhead 120, substrate pedestal 150, or coupled to both the showerhead 120 and the substrate pedestal 150, or coupled to an antenna (not shown) disposed exterior to the process chamber 100. In one or more embodiments, the RF power sources 140 may provide between about 100 watts and about 3,000 watts at a frequency of about 50 kHz to about 13.6 MHz. In another embodiment, the RF power sources 140 may provide between about 500 watts and about 1,800 watts at a frequency of about 50 kHz to about 13.6 MHz.

The controller 110 includes a central processing unit (CPU) 112, a memory 116, and a support circuit 114 utilized to control the process sequence and regulate the gas flows from the gas panel 130. The CPU 112 may be of any form of a general purpose computer processor that may be used in an industrial setting. The software routines can be stored in the memory 116, such as random access memory, read only memory, floppy, or hard disk drive, or other form of digital storage. The support circuit 114 is conventionally coupled to the CPU 112 and may include cache, clock circuits, input/output systems, power supplies, and the like. Bi-directional communications between the controller 110 and the various components of the processing system 132 are handled through numerous signal cables collectively referred to as signal buses 118, some of which are illustrated in FIG. 1.

Other deposition chambers may also benefit from the deposition processes described and discussed herein and the parameters listed above may vary according to the particular deposition chamber used to form phosphorus-doped, silicon nitride film. For example, other deposition chambers may have a larger or smaller volume, requiring gas flow rates that are larger or smaller than those recited for deposition chambers available from Applied Materials, Inc. In one or more embodiments, the phosphorus-doped, silicon nitride film may be deposited using a PRODUCER® SE or GT processing chamber or system which is commercially available from Applied Materials, Inc., Santa Clara, California.

In general, the following exemplary deposition process parameters may be used to form the phosphorus-doped, silicon nitride film. The process parameters may range from a substrate temperature of about 100° C. to about 700° C., for example, between about 200° C. to about 500° C. The chamber pressure may range from a chamber pressure of about 1 Torr to about 20 Torr, for example, between about 2 Torr and about 10 Torr.

In one or more examples, the deposition gas contains one or more silicon precursors, one or more nitrogen precursors, one or more phosphorus precursors, and one or more carrier gases. The silicon precursor, the nitrogen precursor, the phosphorus precursor, and the carrier gas can be co-flowed together when exposing the substrate to the deposition gas. The flow rate of the silicon precursor is in a range from about 200 sccm to about 5,000 sccm, for example, from about 400 sccm to about 2,000 sccm. The flow rate of the nitrogen precursor is in a range from about 200 sccm to about 5,000 sccm, for example, from about 400 sccm to about 2,000 sccm. The flow rate of the phosphorus precursor is in a range from about 10 sccm to about 1,000 sccm, for example, from about 50 sccm to about 500 sccm. The flow rate of the carrier gas is in a range from about 500 sccm to about 20,000 sccm, for example, from about 2,000 sccm to about 10,000 sccm. The flow rate of the hydrogen gas is in a range from about 500 sccm to about 20,000 sccm, for example, from about 2,000 sccm to about 10,000 sccm.

The phosphorus precursor can be or include phosphine ($PH_3$), methylphosphine ($CH_3PH_2$), ethylphosphine ($CH_3CH_2PH_2$), propylphosphine ($CH_3(CH_2)_2PH_2$), butylphosphine ($CH_3(CH_2)_3PH_2$), phosphorus oxychloride ($POCl_3$), trimethylphosphate (($(CH_3)_3P$), triethylphosphate (($CH_3(CH_2))_3P$), isomers thereof, or any combination thereof. The silicon precursor can be or include silane ($SiH_4$), disilane ($Si_2H_6$), trisilane ($Si_3H_8$), tetrasilane ($Si_4H_{10}$), pentasilane ($Si_5H_{12}$), methylsilane ($CH_3SiH_3$), chlorosilane ($SiH_3Cl$), dichlorosilane ($SiH_2Cl_2$), trichlorosilane ($SiHCl_3$), silicon tetrachloride ($SiCl_4$), hexachlorodisilane ($Si_2Cl_6$), or any combinations thereof. The nitrogen precursor can be or include ammonia ($NH_3$), hydrazine ($N_2H_4$), dimethyl hydrazine (($CH_3)_2N_2H_2$), tertert-butylhydrazine ($C_4H_9N_2H_3$), phenylhydrazine ($C_6H_5N_2H_3$), 2,2'-azoisobutane (($CH_3)_6C_2N_2$), ethylazide ($C_2H_5N_3$), isomers thereof, or any combinations thereof. The carrier gas contains nitrogen ($N_2$), argon, helium, plasma thereof, or any combination thereof. In one or more examples, the deposition gas contains phosphine, silane, ammonia, and one or more carrier gases.

In one or more examples, the PE-CVD process is a pulsed plasma process which includes pulsing the RF power on and off while continuing to expose the substrate to the deposition gas. In other examples, the PE-CVD process is a continuous plasma process which includes maintaining the RF power on while continuing to expose the substrate to the deposition gas. An RF power is in a range about 1 W/in² to about 100

W/in², such as about 3 W/in² to about 20 W/in². A plate spacing between the top surface of the substrate and the showerhead is in a range from about 200 mils to about 600 mils, such as about 250 mils to about 400 mils.

Figure 2:
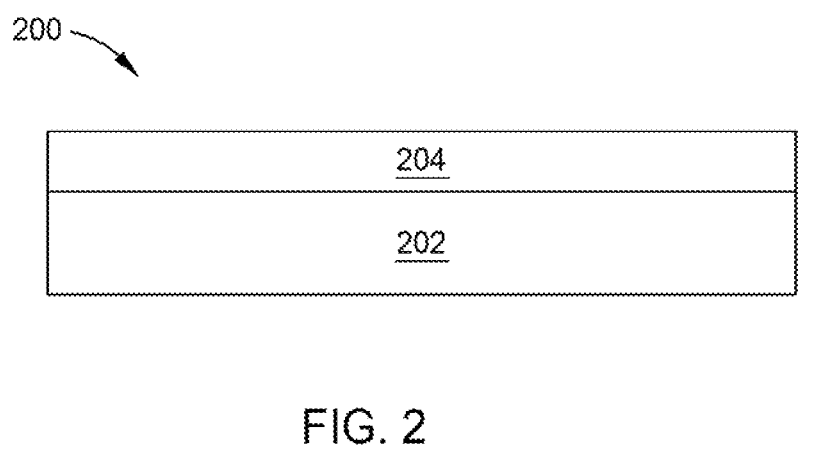

FIG. 2 depicts a schematic cross-sectional view of a substrate structure 200 incorporating a phosphorus-doped, silicon nitride film 204 disposed on a substrate 202, as discussed and described in one or more embodiments herein. The phosphorus-doped, silicon nitride film 204 can be or include a hardmask layer or a stop etch layer, a sacrificial layer, a dummy pattern layer for self-aligned multi patterning, and/or other types of layers and films used in fabrication processes.

The substrate 202, as shown in FIG. 2, has a substantially planar surface. Alternatively, the substrate 202 may have patterned structures, a surface having trenches, holes, or vias formed therein. The substrate 202 may also have a substantially planar surface having a structure formed thereon or therein at a desired elevation. While the substrate 202 is illustrated as a single body, it is understood that the substrate 202 may contain one or more materials used in forming semiconductor devices such as metal contacts, trench isolations, gates, bitlines, or any other interconnect features. The substrate 202 may contain one or more metal layers, one or more dielectric materials, semiconductor material, and/or combinations thereof utilized to fabricate semiconductor devices, display devices, and/or photovoltaic device. For example, the substrate 202 may include an oxide material, a nitride material, a polysilicon material, or the like, depending upon application. In one or more embodiments, where a memory application is desired, the substrate 202 may include the silicon substrate material, an oxide material, and a nitride material, with or without polysilicon sandwiched in between. In other embodiments, the substrate 202 may include a plurality of alternating oxide and nitride materials (e.g., oxide-nitride-oxide (ONO)) deposited on a surface of the substrate (not shown). In various embodiments, the substrate 202 may include a plurality of alternating oxide and nitride materials, one or more oxide or nitride materials, polysilicon or amorphous silicon materials, oxides alternating with amorphous silicon, oxides alternating with polysilicon, undoped silicon alternating with doped silicon, undoped polysilicon alternating with doped polysilicon, or updoped amorphous silicon alternating with doped amorphous silicon. The substrate may be any substrate or material surface upon which film processing is performed. For example, the substrate 202 may be or include one or more materials such as crystalline silicon, silicon oxide, silicon oxynitride, silicon nitride, strained silicon, silicon germanium, tungsten, titanium nitride, doped or undoped polysilicon, doped or undoped silicon wafers and patterned or non-patterned wafers, silicon on insulator (SOI), carbon doped silicon oxides, silicon nitrides, doped silicon, germanium, gallium arsenide, glass, sapphire, low k dielectrics, or any combination thereof.

In one or more embodiments, the phosphorus-doped, silicon nitride film can have a thickness of about 100 Å, about 200 Å, about 300 Å, about 500 Å, about 800 Å, or about 1,000 Å to about 1,500 Å, about 2,000 Å, about 2,500 Å, about 3,000 Å, about 4,000 Å, about 5,000 Å, about 7,000 Å, about 8,500 Å, about 10,000 Å, about 12,000 Å, about 15,000 Å, about 18,000 Å, about 20,000 Å, about 25,000 Å, or about 30,000 Å. For example, the phosphorus-doped, silicon nitride film can have a thickness of about 100 Å to about 30,000 Å, about 100 Å to about 25,000 Å, about 100 Å to about 20,000 Å, about 100 Å to about 15,000 Å, about 100 Å to about 12,000 Å, about 100 Å to about 10,000 Å, about 100 Å to about 8,000 Å, about 100 Å to about 5,000 Å, about 100 Å to about 4,000 Å, about 100 Å to about 3,000 Å, about 100 Å to about 2,000 Å, about 100 Å to about 1,500 Å, about 100 Å to about 1,000 Å, about 100 Å to about 800 Å, about 100 Å to about 500 Å, about 100 Å to about 300 Å, about 100 Å to about 200 Å, about 300 Å to about 30,000 Å, about 300 Å to about 25,000 Å, about 300 Å to about 20,000 Å, about 300 Å to about 15,000 Å, about 300 Å to about 12,000 Å, about 300 Å to about 10,000 Å, about 300 Å to about 8,000 Å, about 300 Å to about 5,000 Å, about 300 Å to about 4,000 Å, about 300 Å to about 3,000 Å, about 300 Å to about 2,000 Å, about 300 Å to about 1,500 Å, about 300 Å to about 1,000 Å, about 300 Å to about 800 Å, about 300 Å to about 500 Å, about 500 Å to about 30,000 Å, about 500 Å to about 25,000 Å, about 500 Å to about 20,000 Å, about 500 Å to about 15,000 Å, about 500 Å to about 12,000 Å, about 500 Å to about 10,000 Å, about 500 Å to about 8,000 Å, about 500 Å to about 5,000 Å, about 500 Å to about 4,000 Å, about 500 Å to about 3,000 Å, about 500 Å to about 2,000 Å, about 500 Å to about 1,500 Å, about 500 Å to about 1,000 Å, or about 500 Å to about 800 Å.

In one or more embodiments, the phosphorus-doped, silicon nitride film is deposited, formed, or otherwise produced at a deposition rate of about 100 Å/min, about 200 Å/min, about 300 Å/min, about 500 Å/min, about 800 Å/min, or about 1,000 Å/min to about 1,500 Å/min, about 2,000 Å/min, about 2,500 Å/min, about 3,000 Å/min, about 4,000 Å/min, about 5,000 Å/min, about 7,000 Å/min, about 8,500 Å/min, about 10,000 Å/min, about 12,000 Å/min, about 15,000 Å/min, about 20,000 Å/min, about 25,000 Å/min, or about 30,000 Å/min. For example, the phosphorus-doped, silicon nitride film is deposited, formed, or otherwise produced at a deposition rate of about 100 Å/min to about 30,000 Å/min, about 100 Å/min to about 25,000 Å/min, about 100 Å/min to about 20,000 Å/min, about 100 Å/min to about 15,000 Å/min, about 100 Å/min to about 12,000 Å/min, about 100 Å/min to about 10,000 Å/min, about 100 Å/min to about 8,000 Å/min, about 100 Å/min to about 5,000 Å/min, about 100 Å/min to about 4,000 Å/min, about 100 Å/min to about 3,000 Å/min, about 100 Å/min to about 2,000 Å/min, about 100 Å/min to about 1,500 Å/min, about 100 Å/min to about 1,000 Å/min, about 100 Å/min to about 800 Å/min, about 100 Å/min to about 500 Å/min, about 100 Å/min to about 300 Å/min, about 100 Å/min to about 200 Å/min, about 500 Å/min to about 30,000 Å/min, about 500 Å/min to about 25,000 Å/min, about 500 Å/min to about 20,000 Å/min, about 500 Å/min to about 15,000 Å/min, about 500 Å/min to about 12,000 Å/min, about 500 Å/min to about 10,000 Å/min, about 500 Å/min to about 8,000 Å/min, about 500 Å/min to about 5,000 Å/min, about 500 Å/min to about 4,000 Å/min, about 500 Å/min to about 3,000 Å/min, about 500 Å/min to about 2,000 Å/min, about 500 Å/min to about 1,500 Å/min, about 500 Å/min to about 1,000 Å/min, or about 500 Å/min to about 800 Å/min.

In one or more examples, the phosphorus-doped, silicon nitride film 204 may be deposited to a thickness of about 100 Å to about 20,000 Å, such as about 300 Å to about 5,000 Å. In some examples, the above process parameters provide a typical deposition rate for the phosphorus-doped, silicon nitride film 204 in the range of about 500 Å/min to about 10,000 Å/min and can be implemented on a 300 mm (diameter) substrate in a deposition chamber available from Applied Materials, Inc. of Santa Clara, CA.

The phosphorus-doped, silicon nitride film 204 has a silicon concentration in a range from about 15 atomic percent (at %), about 20 at %, about 25 at %, about 30 at %, about 35 at %, about 38 at %, or about 40 at % to about 41 at %, about 42 at %, about 43 at %, about 45 at %, about 48 at %, about 50 at %, about 52 at %, about 55 at %, or about 60 at %. For example, the phosphorus-doped, silicon nitride film 204 has a silicon concentration in a range from about 15 at % to about 60 at %, about 20 at % to about 60 at %, about 25 at % to about 60 at %, about 30 at % to about 60 at %, about 35 at % to about 60 at %, about 38 at % to about 60 at %, about 40 at % to about 60 at %, about 42 at % to about 60 at %, about 45 at % to about 60 at %, about 50 at % to about 60 at %, about 15 at % to about 55 at %, about 25 at % to about 55 at %, about 35 at % to about 55 at %, about 40 at % to about 55 at %, about 15 at % to about 45 at %, about 20 at % to about 45 at %, about 25 at % to about 45 at %, about 30 at % to about 45 at %, about 35 at % to about 45 at %, about 38 at % to about 45 at %, about 40 at % to about 45 at %, or about 42 at % to about 45 at %.

The phosphorus-doped, silicon nitride film 204 has a nitrogen concentration in a range from about 25 at %, about 30 at %, about 35 at %, about 40 at %, about 45 at %, or about 50 at % to about 52 at %, about 54 at %, about 55 at %, about 58 at %, about 60 at %, about 65 at %, about 70 at %, or about 75 at %. For example, the phosphorus-doped, silicon nitride film 204 has a nitrogen concentration in a range from about 25 at % to about 75 at %, about 25 at % to about 70 at %, about 25 at % to about 65 at %, about 25 at % to about 60 at %, about 25 at % to about 55 at %, about 25 at % to about 50 at %, about 25 at % to about 45 at %, about 25 at % to about 40 at %, about 40 at % to about 75 at %, about 40 at % to about 70 at %, about 40 at % to about 65 at %, about 40 at % to about 60 at %, about 40 at % to about 55 at %, about 40 at % to about 54 at %, about 40 at % to about 50 at %, or about 40 at % to about 45 at %.

The phosphorus-doped, silicon nitride film 204 has a phosphorus concentration of about 0.1 at %, about 0.5 at %, about 0.8 at %, about 1 at %, about 1.5 at %, or about 2 at % to about 2.5 at %, about 3 at %, about 3.5 at %, about 4 at %, about 4.5 at %, about 5 at %, about 6 at %, about 7 at %, about 8 at %, about 9 at %, about 10 at %, or greater. For example, the phosphorus-doped, silicon nitride film 204 has a phosphorus concentration of about 0.1 at % to about 10 at %, about 0.1 at % to about 8 at %, about 0.1 at % to about 6 at %, about 0.1 at % to about 5 at %, about 0.1 at % to about 4 at %, about 0.1 at % to about 3 at %, about 0.1 at % to about 2 at %, about 0.1 at % to about 1 at %, about 0.1 at % to about 0.5 at %, about 0.5 at % to about 10 at %, about 0.5 at % to about 8 at %, about 0.5 at % to about 6 at %, about 0.5 at % to about 5 at %, about 0.5 at % to about 4 at %, about 0.5 at % to about 3 at %, about 0.5 at % to about 2 at %, about 0.5 at % to about 1 at %, about 1 at % to about 10 at %, about 1 at % to about 8 at %, about 1 at % to about 6 at %, about 1 at % to about 5 at %, about 1 at % to about 4 at %, about 1 at % to about 3 at %, about 1 at % to about 2 at %, or about 1 at % to about 1.5 at %.

In one or more embodiments, the phosphorus-doped, silicon nitride film may be densified by exposing the substrate to hydrogen while continuing to expose the substrate to the deposition gas. The hydrogen can be or include hydrogen gas ($H_2$), atomic hydrogen, plasmas thereof, or any combination thereof. In other embodiments, the overall process can be altered in order to densify the phosphorus-doped, silicon nitride film. For example, the phosphorus-doped, silicon nitride film can be densified by sequentially alternating between cycles of the PE-CVD process and a nitrogen-plasma process until the desired thickness of the phosphorus-doped, silicon nitride film is obtained. The PE-CVD process can be a continuous plasma process or a pulsed (discontinuous) plasma process. The nitrogen-plasma process is a densifying process that includes exposing the substrate to a nitrogen plasma while ceasing to expose the substrate to the deposition gas. The nitrogen plasma can be produced from nitrogen gas ($N_2$) and at least one or more gases, such as argon, helium, or a combination thereof.

In some examples, a deposition method includes exposing a substrate to the deposition gas to deposit the phosphorus-doped, silicon nitride film on the substrate during a PE-CVD process, where the deposition gas contains one or more silicon precursors, one or more nitrogen precursors, one or more phosphorus precursors, and one or more carrier gases. The phosphorus-doped, silicon nitride film has a phosphorus concentration in a range from about 0.1 at % to about 10 at %. The method also includes ceasing the PE-CVD process, then exposing the substrate to a nitrogen plasma to densify the phosphorus-doped, silicon nitride film during a nitrogen-plasma process, and ceasing the nitrogen-plasma process. The method further includes sequentially repeating cycles of the PE-CVD process and the nitrogen-plasma process.

EXPERIMENTAL

Figure 3:
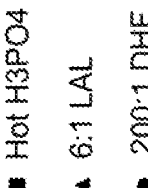
FIG. 3 is a graph of etch rates versus phosphorus concentrations for phosphorus-doped and undoped silicon nitride films, as discussed and described in one or more embodiments herein.
Figure 3:
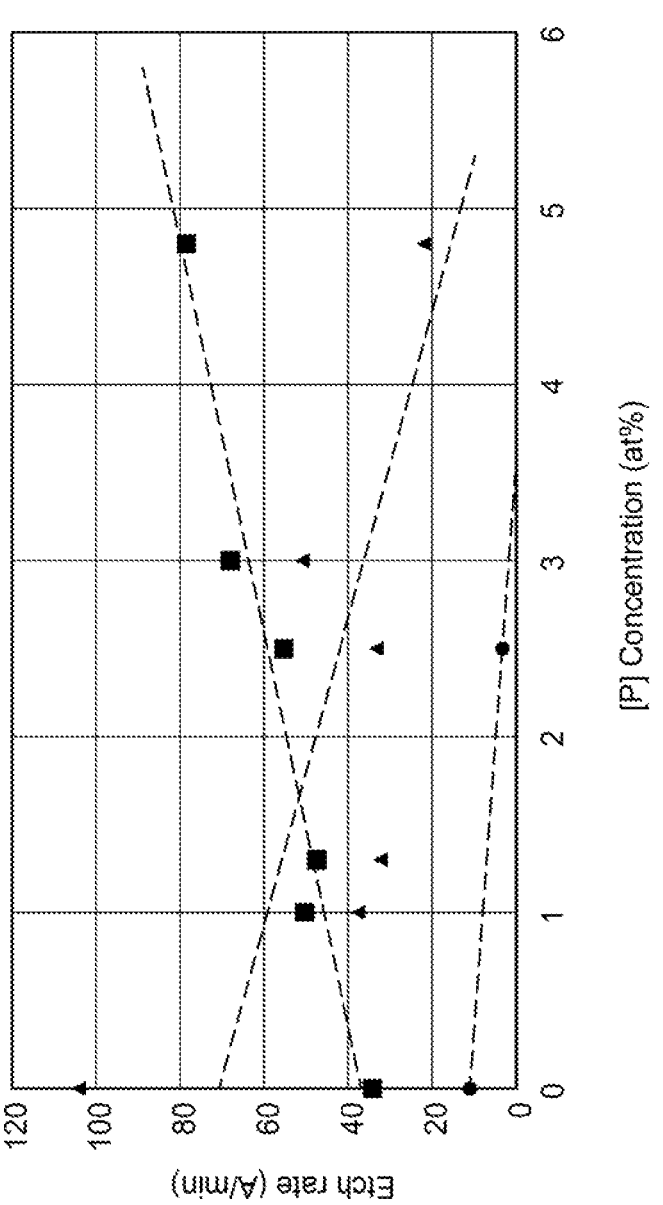

FIG. 3 is a graph of etch rates versus phosphorus concentrations for phosphorus-doped and undoped silicon nitride films which were exposed to various etchants, as discussed and described in one or more embodiments herein. The three etchants, as labeled in FIG. 3, included hot phosphoric acid ($H_3PO_4$), 6:1 LAL solution, and 200:1 dilute hydrofluoric acid (DHF) solution. The hot phosphoric acid was heated to a temperature of about 50° C. The 6:1 LAL solution was a mixture containing ammonium fluoride, hydrogen fluoride, and water. The 6:1 LAL solution contained about 6:1:6 by weight of ammonium fluoride to hydrogen fluoride to water. The DHF solution contained about 200:1 by weight deionized water to hydrogen fluoride.

Silicon nitride films without phosphorus were etched at the following rates: about 102 Å/min in 6:1 LAL, about 37 Å/min in hot phosphoric acid, and about 10 Å/min in 200:1 DHF.

With in-situ doping of phosphorus in PECVD silicon nitride, the phosphorus-doped, silicon nitride films show tunable wet etch rates in the various etchant solutions. For the greater values of the phosphorus concentrations (0% to about 4.8% of [P]), the etch rates in 6:1 LAL dropped by about 80% from about 102 km in to about 21 Å/min. Although not as great, the etch rates in 200:1 DHF dropped from about 10 Å/min (0% of [P]) to about 2 Å/min (about 2.5% of [P]). For the greater values of the phosphorus concentrations (0% to about 4.8% of [P]), the etch rates in hot phosphoric acid increased by about 114% from about 37 Å/min to about 79 Å/min.

Embodiments of the present disclosure further relate to any one or more of the following paragraphs 1-21:

1. A method of depositing a material on a substrate in a processing chamber, comprising: exposing a substrate to a deposition gas in the presence of RF power to deposit a phosphorus-doped, silicon nitride film on the substrate during a plasma-enhanced chemical vapor deposition process, wherein: the deposition gas comprises a silicon precursor, a nitrogen precursor, a phosphorus precursor, and a carrier gas; and the phosphorus-doped, silicon nitride film has a phosphorus concentration in a range from about 0.1 atomic percent (at %) to about 10 at %.

2. A method of depositing a material on a substrate in a processing chamber, comprising: exposing a substrate to a deposition gas while depositing a phosphorus-doped, silicon nitride film on the substrate during a plasma-enhanced chemical vapor deposition process, wherein: the deposition gas comprises a silicon precursor, a nitrogen precursor, a phosphorus precursor, and a carrier gas; and the phosphorus-doped, silicon nitride film has a phosphorus concentration in a range from about 0.5 atomic percent (at %) to about 8 at %.

3. A method of depositing a material on a substrate in a processing chamber, comprising: exposing a substrate to a deposition gas to deposit a phosphorus-doped, silicon nitride film on the substrate during a plasma-enhanced chemical vapor deposition process, wherein: the deposition gas comprises a silicon precursor, a nitrogen precursor, a phosphorus precursor, and a carrier gas; and the phosphorus-doped, silicon nitride film has a phosphorus concentration in a range from about 0.1 atomic percent (at %) to about 10 at %; ceasing the plasma-enhanced chemical vapor deposition process; then exposing the substrate to a nitrogen plasma to densify the phosphorus-doped, silicon nitride film during a nitrogen-plasma process; ceasing the nitrogen-plasma process; and sequentially repeating cycles of the plasma-enhanced chemical vapor deposition process and the nitrogen-plasma process.

4. The method according to any one of paragraphs 1-3, further comprising turning off the RF power while continuing to expose the substrate to the deposition gas.

5. The method according to any one of paragraphs 1-4, wherein the plasma-enhanced chemical vapor deposition process is a pulsed plasma process which comprises pulsing the RF power on and off while continuing to expose the substrate to the deposition gas.

6. The method according to any one of paragraphs 1-5, wherein the plasma-enhanced chemical vapor deposition process is a continuous plasma process which comprises maintaining the RF power on while continuing to expose the substrate to the deposition gas.

7. The method according to any one of paragraphs 1-6, further comprising densifying the phosphorus-doped, silicon nitride film by exposing the substrate to hydrogen while continuing to expose the substrate to the deposition gas.

8. The method according to any one of paragraphs 1-7, further comprising densifying the phosphorus-doped, silicon nitride film by sequentially alternating between cycles of the plasma-enhanced chemical vapor deposition process and a nitrogen-plasma process, wherein the nitrogen-plasma process comprises exposing the substrate to a nitrogen plasma while ceasing to expose the substrate to the deposition gas.

9. The method according to any one of paragraphs 1-8, wherein the phosphorus concentration is in a range from about 0.5 at % to about 8 at %.

10. The method according to any one of paragraphs 1-9, wherein the phosphorus concentration is in a range from about 1 at % to about 6 at %.

11. The method according to any one of paragraphs 1-10, wherein the phosphorus-doped, silicon nitride film has a nitrogen concentration in a range from about 40 at % to about 70 at %.

12. The method according to any one of paragraphs 1-11, wherein the phosphorus-doped, silicon nitride film has a silicon concentration in a range from about 25 at % to about 55 at %.

13. The method according to any one of paragraphs 1-12, wherein the phosphorus precursor comprises phosphine, methylphosphine, ethylphosphine, propylphosphine, butylphosphine, phosphorus oxychloride, trimethylphosphate, triethylphosphate, isomers thereof, or any combination thereof.

14. The method according to any one of paragraphs 1-13, wherein the nitrogen precursor comprises ammonia, hydrazine, dimethyl hydrazine, tert-butylhydrazine, phenylhydrazine, 2,2'-azoisobutane, ethylazide, isomers thereof, or any combinations thereof.

15. The method according to any one of paragraphs 1-14, wherein the silicon precursor comprises silane, disilane, trisilane, tetrasilane, pentasilane, methylsilane, chlorosilane, dichlorosilane, trichlorosilane, silicon tetrachloride, hexachlorodisilane, or any combinations thereof.

16. The method according to any one of paragraphs 1-15, wherein the carrier gas comprises nitrogen ($N_2$), argon, helium, plasma thereof, or any combination thereof.

17. The method according to any one of paragraphs 1-16, wherein the phosphorus-doped, silicon nitride film is a hardmask layer or a stop etch layer.

18. The method according to any one of paragraphs 1-17, wherein the deposition gas comprises phosphine, silane, and ammonia, and wherein the phosphorus concentration is in a range from about 1 at % to about 6 at %.

19. The method according to any one of paragraphs 1-18, wherein the plasma-enhanced chemical vapor deposition process is a pulsed plasma process which comprises pulsing an RF power on and off while continuing to expose the substrate to the deposition gas.

20. The method according to any one of paragraphs 1-19, wherein the plasma-enhanced chemical vapor deposition process is a continuous plasma process which comprises maintaining an RF power on while continuing to expose the substrate to the deposition gas.

21. A processing chamber or system for conducting or performing the method according to any one of paragraphs 1-20.

While the foregoing is directed to embodiments of the disclosure, other and further embodiments may be devised without departing from the basic scope thereof, and the scope thereof is determined by the claims that follow. All documents described herein are incorporated by reference herein, including any priority documents and/or testing procedures to the extent they are not inconsistent with this text. As is apparent from the foregoing general description and the specific embodiments, while forms of the present disclosure have been illustrated and described, various modifications can be made without departing from the spirit and scope of the present disclosure. Accordingly, it is not intended that the present disclosure be limited thereby. Likewise, the term "comprising" is considered synonymous with the term "including" for purposes of United States law. Likewise whenever a composition, an element or a group of elements is preceded with the transitional phrase "comprising", it is understood that we also contemplate the same composition or group of elements with transitional phrases "consisting essentially of," "consisting of", "selected from the group of consisting of," or "is" preceding the recitation of the composition, element, or elements and vice versa.

Certain embodiments and features have been described using a set of numerical upper limits and a set of numerical lower limits. It should be appreciated that ranges including the combination of any two values, e.g., the combination of any lower value with any upper value, the combination of any two lower values, and/or the combination of any two upper values are contemplated unless otherwise indicated. Certain lower limits, upper limits and ranges appear in one or more claims below.

What is claimed is:

1. A method of depositing a material on a substrate in a processing chamber, comprising:
exposing a substrate to a deposition gas in the presence of RF power to deposit a phosphorus-doped, silicon nitride film on the substrate during a plasma-enhanced chemical vapor deposition process, wherein:
the deposition gas comprises a silicon precursor, a nitrogen precursor, a phosphorus precursor, and a carrier gas; and
the phosphorus-doped, silicon nitride film has a phosphorus concentration in a range from about 0.1 atomic percent (at %) to about 10 at %.

2. The method of claim 1, further comprising turning off the RF power while continuing to expose the substrate to the deposition gas.

3. The method of claim 1, wherein the plasma-enhanced chemical vapor deposition process is a pulsed plasma process which comprises pulsing the RF power on and off while continuing to expose the substrate to the deposition gas.

4. The method of claim 1, wherein the plasma-enhanced chemical vapor deposition process is a continuous plasma process which comprises maintaining the RF power on while continuing to expose the substrate to the deposition gas.

5. The method of claim 1, further comprising densifying the phosphorus-doped, silicon nitride film by exposing the substrate to hydrogen while continuing to expose the substrate to the deposition gas.

6. The method of claim 1, further comprising densifying the phosphorus-doped, silicon nitride film by sequentially alternating between cycles of the plasma-enhanced chemical vapor deposition process and a nitrogen-plasma process, wherein the nitrogen-plasma process comprises exposing the substrate to a nitrogen plasma while ceasing to expose the substrate to the deposition gas.

7. The method of claim 1, wherein the phosphorus concentration is in a range from about 0.5 at % to about 8 at %.

8. The method of claim 1, wherein the phosphorus concentration is in a range from about 1 at % to about 6 at %.

9. The method of claim 1, wherein the phosphorus-doped, silicon nitride film has a nitrogen concentration in a range from about 40 at % to about 70 at %.

10. The method of claim 1, wherein the phosphorus-doped, silicon nitride film has a silicon concentration in a range from about 25 at % to about 55 at %.

11. The method of claim 1, wherein the phosphorus precursor comprises phosphine, methylphosphine, ethylphosphine, propylphosphine, butylphosphine, phosphorus oxychloride, trimethylphosphate, triethylphosphate, isomers thereof, or any combination thereof.

12. The method of claim 1, wherein the nitrogen precursor comprises ammonia, hydrazine, dimethyl hydrazine, tert-butylhydrazine, phenylhydrazine, 2,2'-azoisobutane, ethylazide, isomers thereof, or any combinations thereof.

13. The method of claim 1, wherein the silicon precursor comprises silane, disilane, trisilane, tetrasilane, pentasilane, methylsilane, chlorosilane, dichlorosilane, trichlorosilane, silicon tetrachloride, hexachlorodisilane, or any combinations thereof.

14. The method of claim 1, wherein the carrier gas comprises nitrogen ($N_2$), argon, helium, plasma thereof, or any combination thereof.

13

14

15. The method of claim 1, wherein the phosphorus-doped, silicon nitride film is a hardmask layer or a stop etch layer.

16. A method of depositing a material on a substrate in a processing chamber, comprising:

exposing a substrate to a deposition gas while depositing a phosphorus-doped, silicon nitride film on the substrate during a plasma-enhanced chemical vapor deposition process, wherein:

the deposition gas comprises a silicon precursor, a nitrogen precursor, a phosphorus precursor, and a carrier gas; and the phosphorus-doped, silicon nitride film has a phosphorus concentration in a range from about 0.5 atomic percent (at %) to about 8 at %.

17. The method of claim 16, wherein the deposition gas comprises phosphine, silane, and ammonia, and wherein the phosphorus concentration is in a range from about 1 at % to about 6 at %.

18. A method of depositing a material on a substrate in a processing chamber, comprising:

exposing a substrate to a deposition gas to deposit a phosphorus-doped, silicon nitride film on the substrate during a plasma-enhanced chemical vapor deposition process, wherein:

the deposition gas comprises a silicon precursor, a nitrogen precursor, a phosphorus precursor, and a carrier gas; and the phosphorus-doped, silicon nitride film has a phosphorus concentration in a range from about 0.1 atomic percent (at %) to about 10 at %;

ceasing the plasma-enhanced chemical vapor deposition process; then exposing the substrate to a nitrogen plasma to densify the phosphorus-doped, silicon nitride film during a nitrogen-plasma process;

ceasing the nitrogen-plasma process; and sequentially repeating cycles of the plasma-enhanced chemical vapor deposition process and the nitrogen-plasma process.

19. The method of claim 18, wherein the plasma-enhanced chemical vapor deposition process is a pulsed plasma process which comprises pulsing an RF power on and off while continuing to expose the substrate to the deposition gas.

20. The method of claim 18, wherein the plasma-enhanced chemical vapor deposition process is a continuous plasma process which comprises maintaining an RF power on while continuing to expose the substrate to the deposition gas.

* * * * *